United States Patent [19]

Babu et al.

[11] Patent Number: 4,956,197

[45] Date of Patent: Sep. 11, 1990

[54] PLASMA CONDITIONING OF A SUBSTRATE FOR ELECTROLESS PLATING

[75] Inventors: Suryadevara V. Babu, Potsdam, N.Y.; Neng-Hsing Lu, Berkeley Heights, N.J.; Gerald W. Jones, Johnson City, N.Y.

[73] Assignee: International Business Machines Corporation, Armonk, N.Y.

[21] Appl. No.: 253,321

[22] Filed: Sep. 30, 1988

Related U.S. Application Data

[63] Continuation of Ser. No. 923,291, Oct. 27, 1986, abandoned.

[51] Int. Cl.$^5$ .................. C23C 18/04; B05D 3/06; B05D 3/04
[52] U.S. Cl. .................. 427/39; 427/40; 427/96; 427/98; 427/304; 427/305; 427/306; 156/643
[58] Field of Search .................. 427/38, 39, 40, 41, 427/96, 97, 98, 304, 305, 306; 156/643

[56] References Cited

U.S. PATENT DOCUMENTS

| | | | |
|---|---|---|---|
| 4,568,562 | 2/1986 | Phillips | 427/40 |
| 4,597,828 | 7/1986 | Tadrou | 156/643 |
| 4,615,763 | 10/1986 | Gelorme | 427/98 |
| 4,707,394 | 11/1987 | Chant | 427/96 |

FOREIGN PATENT DOCUMENTS 5912943 1/1981 Japan .
200967 11/1985 Japan .

*Primary Examiner*—Norman Morgenstern
*Assistant Examiner*—Margaret Bueker
*Attorney, Agent, or Firm*—Pollock, Vande Sande & Priddy

[57] ABSTRACT

A dielectric surface is conditioned for electroless plating of a conductive metal thereon by exposing the substrate to a gaseous plasma obtained from ammonia and/or an organic amine. The conditioning can be in the holes and/or on the surfaces of the substrate.

15 Claims, No Drawings

PLASMA CONDITIONING OF A SUBSTRATE FOR ELECTROLESS PLATING

This application is a continuation, of Ser. No. 923,291, filed on Oct. 27, 1986 now abandoned.

DESCRIPTION

1. Technical Field

The present invention is concerned with conditioning a dielectric material and is particularly concerned with treating a dielectric substrate to prepare the substrate for the electroless deposition of a conductive metal thereon. The conditioning can be in the holes and/or on the surfaces of the substrate. The present invention finds particular applicability in the manufacture of printed circuit cards and boards.

2. Background Art

In the manufacture of printed, circuit cards and boards, a dielectric sheet material is employed as the substrate. A conductive circuit pattern is provided on one or both of the major surfaces of the substrate.

A conductive pattern can be formed on the surface of a substrate using a variety of known techniques. These known techniques include the subtractive technique where a layer of copper is etched to form the desired circuit pattern, the EDB (electroless direct bond) technique where copper is electrolessly plated directly on the surface of the substrate in the desired pattern, the peel-apart technique where the desired circuit pattern is plated up from a thin layer of peel-apart copper. In addition, connections between layers are made by means of plated through holes or vias. In plating such holes, copper must be plated directly on the dielectric substrate (on the walls of the holes or vias). In addition, if one employs the electroless direct bond technique, it is necessary to plate directly on the surface of the substrate.

Since the dielectric substrate is nonconductive, in order to plate on the substrate (either on the walls of the holes or on the surface of a substrate) the substrate must be seeded or catalyzed prior to the deposition of metal onto the substrate.

Among the more widely employed procedures for catalyzing a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by first treating it with a solution of a colloidal metal, accelerating the treatment with a selective solvent to remove protective colloids from the sensitized dielectric substrate and then electrolessly depositing a metal coating on the sensitized substrate; for example, with copper from a solution of a copper salt in a reducing agent. Also, as suggested, in U.S. Pat. No. 3,009,608, a dielectric substrate can be pretreated by depositing a thin film of a "conductivator" type of metal particles such as palladium metal from a semicolloidal solution onto the dielectric substrate to provide a conducting base that permits electroplating with conductive metal on the conductivated base.

U.S. Pat. No. 4,066,809 discloses the use of a so-called "triple seeding" technique. This technique disclosed in U.S. Pat. No. 4,066,809 includes contacting the surfaces of the dielectric material with an aqueous stannous chloride sensitizing solution followed by contacting the surfaces of the dielectric material with an aqueous palladium chloride activator solution and then followed by contacting the surfaces of the dielectric material with an aqueous palladium chloride/stannous chloride/hydrochloric acid seeder bath.

More recently, it has been disclosed in U.S. Pat. Nos. 4,478,883 and 4,554,182, disclosures of which are incorporated herein by reference, that increased efficiency of the seeding or activation of a dielectric substrate for subsequent electroless plating which in turn results in improved and more reliable electroless plating of conductive metals can be obtained by conditioning the surface with a composition containing a multifunctional ionic polymer material containing at least two available ionic moieties. Included among such materials are copolymers of a nonreactive backbone chain of polyacrylamide to which is attached a short chain of a tetra-alkylammonium compound.

Although the conditioning processes disclosed in U.S. Pat. Nos. 4,554,182 and 4,478,883 are satisfactory for the most part, they require wet processing and suffer from those problems inherently associated with wet process techniques. Included among the difficulties associated with wet processing techniques are environmental and safety concerns. For example, the aqueous compositions are susceptible to hydrolysis and bacterial attack. This requires the disposal of such compositions on a fairly regular basis such as daily and the preparation of new compositions on a regular basis.

Also, extreme care must be exercised in controlling the composition and the amount of the polymer retained on a substrate surface for consistency from batch to batch. This in turn entails careful control of the agitation of the composition, the temperature, and time that the coated substrate is present in a subsequent rinse bath and the purity of the compositions employed. In view of the necessary control, at times, the amount of polymer retained on a substrate varies from that desired which in turn results in differing amounts of seeder composition retained on the surface. This, in turn, can cause problems if the deviation from the amount desired is too great. For instance, the concentration of seeder retained on a substrate is critical since if too little is present poor plating occurs and if too much is present blistering of the resist and subsequent plated copper occurs.

It has also been noted that some degradation in the adhesion of the photoresist employed to delineate the subsequently plated metal can occur when employing the above wet processing techniques.

DISCLOSURE OF INVENTION

The present invention is concerned with a process for conditioning the dielectric substrate that does not require wet chemical processing and accordingly eliminates those problems inherent in wet chemical processing. In addition, the process of the present invention provides for increased adhesion between the substrate and photoresist that is employed in delineating the pattern of subsequently plated metal. The process of the present invention is concerned with dry plasma conditioning of a dielectric substrate. In particular, it has been found in accordance with the present invention that a dielectric substrate material for subsequent electroless plating of a conductive metal thereon can be conditioned by exposing the substrate to a gaseous plasma. The gaseous plasma is obtained from ammonia or an organic amine or mixtures thereof. The substrate after exposure to the gaseous plasma is then activated by being contacted with a composition containing a colloidal catalyst to provide directly or as a precursor leading to catalytic sites capable of electroless plating initiation of a conductive metal thereon.

The present invention makes it possible to achieve excellent plating, both in the holes and if an EDB process is being used on the major surfaces with the use of only a single seeder step.

BEST AND VARIOUS MODES FOR CARRYING OUT INVENTION

The process of the present invention is applicable to treating or conditioning a wide variety of dielectric (nonconductor) substrates. Dielectric substrates and preferably thermosetting resins may be treated in accordance with the present invention.

Typical thermosetting polymeric materials include epoxy, phenolic base materials, polyimides and polyamides. The dielectric materials may be molded articles of the polymers containing fillers and/or reinforcing agents such as glass filled epoxy or phenolic base materials. Examples of some phenolic type materials include copolymers of phenol, resorcinol and cresol. The most preferred substrates treated in accordance with the present invention contain polar groups that are reactive with ammonia and/or amines and include hydroxy and epoxy moieties.

Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, and alicyclic epoxy resins such as bis(3,4-epoxy-6-methylcyclohexamethyl) adipate. The most usual epoxy employed is of the bisphenol A type.

Also, the resinous epoxy compositions can contain accelerating agents and curing agents, as well-known in the art. Examples of suitable curing agents include polyamines, primary, secondary, and tertiary amines, polyamides, polysulfones, urea-phenol-formaldehyde, and acids or anhydrides thereof. In addition, suitable curing agents include Lewis acid catalysts such as $BF_3$ and complexes thereof.

The dielectric substrate usually contains fillers and/or reinforcing fibers such as glass fibers. Such compositions containing fibers are usually prepared by impregnating the fibers with the epoxy composition. The amount of the epoxy composition when combined with the fibers is usually about 30% to about 70% by weight and more usually about 55% to about 65% by weight of the total of the solids content of the epoxy composition and the fiberglass.

After combining with the reinforcing fibers, the composition is cured to the B-stage and molded to the desired shape, such as a sheet. When sheets are employed, the thickness is usually about 1.5 mils to about 8 mils and preferably about 2 mils to about 3 mils. The curing to the B-stage is generally achieved by using temperatures of about 80° C. to about 110° C. and for times of about 3 minutes to about 10 minutes.

The substrate can then be laminated onto another supporting substrate as is generally practiced. For instance, the bonding of substrates can be carried out by pressing together a number of sheets of the substrate in a preheated laminating press at a predetermined pressure and temperature as, for example, about 200 psi to about 500 psi and preferably about 250 psi to about 300 psi and at about 180° C. The time of the pressing operation is variable, depending upon the particular materials employed and the pressures applied. About 1 hour is adequate for the above conditions.

The term "surface" as employed herein, refer to the surfaces inside through holes as well as the major surfaces of the substrate. For instance, the present invention is useful for seeding the plated through holes where the circuitry is being applied by either additively plating upon a thin layer of peel-a-part copper or by a subtractive process. Also, the present invention is useful for seeding in a solution where an electroless direct bond (EDB) is being used. In this case, the circuitry is additively plated both in the holes and over the surface of the substrate in those areas where desired.

Prior to the initiation of the process of the present invention for treating the dielectric substrate, the required through holes in the substrate are made and the dielectric with through holes is suitably cleaned and preconditioned.

For instance, the preconditioning can include creation of active sites by physical means such as the sacrificial foil technique, sand, and/or vapor blasting and/or chemical methods such as solvent swelling. A typical solvent is N-methyl pyrrolidone. The substrate can also be pretreated with a sulfochromic acid composition.

In accordance with the present invention, the substrate is exposed to a gaseous plasma obtained from ammonia and/or an organic amine. Suitable organic amines are represented by the formulas: $R^1N(R^2)_2$ and $R^{(R2)}_2NR^3N(R^2)_2$.

$R^1$ is a monovalent hydrocarbon group.

Each $R^2$ individually is a hydrogen atom or a monovalent hydrocarbon group. $R^3$ is a divalent hydrocarbon group. The hydrocarbon groups usually contain 1 to about 12 carbon atoms, and preferably 1 to 4 carton atoms.

Moreover, the hydrocarbon groups bonded to the nitrogen atoms can be substituted with substituent atoms such as halogen atoms, hydroxy groups, and alkoxy groups.

Examples of suitable amines include methylamine, dimethylamine, trimethylamine, diethylamine, triethylamine, n-propylamine, di-n-propylamine, tri-n-propylamine, n-butylamine, n-amylamine, n-hexylamine, laurylamine, ethylenediamine, trimethylenediamine, hexamethylenediamine, ethanolamine, diethanolamine, allylamine, allyldimethylamine, 2-aminodiethylether, 1-dimethylamino-2-chloroethane, cyclopropylamine, cyclohexylamine, ethyleneimine, and 1-methylethyleneimine.

The ammonia and/or amine can be used alone or combinations of such can be employed. In addition, if desired, the ammonia and/or amines can be diluted with an inorganic gas such as helium, argon, neon, nitrogen, nitrous oxide, nitric oxide, nitrogen dioxide, oxygen, air, carbon monoxide, carbon dioxide, and hydrogen. In the event inorganic diluent gases are employed in the plasma atmosphere it is preferred that such be employed in amounts of one-tenth or below of the partial pressure of the ammonia and/or organic amine gas.

The plasma treatment comprises first evacuating the plasma reaction chamber to a desired base pressure such as below about $10^{-5}$ torr. After the chamber has had an opportunity to stabilize at a desired working pressure, by flowing the ammonia and/or organic amine containing gas, at rates of about 20 to about 4000 standard cubic centimeters per minute typical of which is about 1,000 standard cubic centimeters per minute, a current at a desired frequency and desired level of power is supplied by means of electrodes and an external power source. The desired pressure of the plasma treatment is about 0.1 torr to about 4 torr, and preferably about 0.2 to about .8 torr. The temperature of the substrate is generally about normal room temperature to about 300° F. The power density employed is usually about 0.01 watts per square centimeter to about 0.5 watts per square centimeter of the area of one surface of the electrodes of the plasma apparatus.

The treatment is normally carried out for about 10 minutes to about 150 minutes.

The power and current that are supplied to the electrodes of the plasma apparatus cause a plasma to be created in the reaction chamber thereof wherein is placed the substrates to be treated.

The power which is employed may be obtained from any source of electrical energy, a specific example being a generator.

Plasma reactors suitable for carrying out the plasma treatment of the present invention are commercially available and need not be discussed herein in any detail. Typical commercially available plasma reactors suitable for carrying out the present invention are Phoenix Material Company (PMC) Model 711; Branson IPC-Parallel Plate Reactor Model 7415; in-line plasma system available from Koksai, Applied Plasma System's plasma reactor; and Technics plasma reactor.

After the substrate is treated with the plasma in accordance with the present invention, the substrate is activated by contact with a composition containing a catalytic composition capable of initiating the electroless plating process. The composition contains a metal which can directly provide the catalytic sites or serves as a precursor which leads to the catalytic sites. The metal present in the catalytic composition may be in the elemental form, an alloy, or compound, or mixtures thereof. The preferred metal catalysts are precious metals such as gold, palladium, and platinum.

The most preferred catalyst is palladium. A typical palladium composition contains about 1.2 to 2.5 grams/liter of a palladium salt which is preferably $PdCl_2$, about 80 to 150 grams/liter of a stannous salt which is preferably $SnCl_2 \cdot 2H_2O$, and about 100 to 150 milliliters per liter of an acid which is preferably HCl. When HCl is provided in the form of a 37% HCl solution, about 280 to about 360 milliliters of the HCl is preferably employed. The most preferred compositions contain about 1.5 grams per liter of $PdCl_2$, about 80 grams per liter of $SnCl_2 \cdot 2H_2O$ and about 280 milliliters per liter of 37% HCl. The composition is usually maintained at a temperature of about 65°±10° F.

A typical triple seeder process includes first contacting the dielectric substrate surfaces and/or the through holes with a stannous chloride sensitizing solution ($SnCl_2$/HCl). Typically, the contacting time is from 4 to 10 minutes and more typically about 7 minutes. The stannous chloride is then rinsed from the substrate and/or through holes with water. A hot water rinse being in a temperature range from 55° C. to about 80° C. is typical.

The next seeding step includes contacting the dielectric substrate surfaces and/or the through hole surfaces with a palladium chloride activator. This may be accomplished by immersing the dielectric in the palladium activator bath for 2±1 minutes.

The third step of the seeding process includes contacting the substrate surface and/or through hole surfaces with a palladium chloride/stannous chloride/hydrochloric acid seeder bath. The contact time can vary from 1 to 10 minutes with about 5 minutes being typical.

In preparing the solution for the first step of the process, a combination of stannous chloride having a content of between 53 and 57 grams per liter of $SnCl_2 \cdot 2H_2O$ with 37% hydrochloric acid at a ratio of 50 milliliters per liter with the pH of the solution adjusted to a range between 0.2 and 0.5 provides a desired preconditioning solution. The $SnCl_2 \cdot 2H_2O$ is dissolved in the HCl with the resulting mixture being added to a tank of deionized water. The pH is typically about 0.4 and the solution is maintained at a temperature of 65°±10° F.

For the second step of the triple seeder process, the palladium chloride bath is formed by mixing 50 grams of palladium (with a concentration of 0.13 to 0.17 grams per liter) with approximately 3780 milliliters of 37% hydrochloric acid. The $PdCl_2$ is dissolved in the hydrochloric acid with the resultant mixture being added to a tank of deionized water. Again, the bath is maintained at a temperature of 65°±10° F., and the pH is maintained between 0.75 and 1.00.

The final catalytic palladium chloride/stannous chloride/hydrochloric acid seeder bath includes a bath comprising 1.2 to 2.5 grams per liter of $PdCl_2$ with 80 per liter of $SnCl_2 \cdot 2H_2O$ together with to 150 grams between 280 and 360 milliliters of 37% HCl per liter of solution. This third seeding bath is again maintained at a temperature of 65°±10° F. A typical solution of the bath includes about 1.5 grams per liter of $PdCl_2$, 100 grams per liter of $SnCl_2$ and 280 milliliters per liter of 37% hydrochloric acid.

Next a metal such as nickel or copper, is plated by electroless plating onto the treated surface. The metal is coated to the desired thickness. The preferred metal employed is copper. Typical copper electroless plating baths and their method of application are disclosed in U.S. Pat. Nos. 3,844,799, 4,152,467, disclosures of which are incorporated herein by reference.

The copper electroless plating bath is generally an aqueous composition which includes a source of cupric ion, a reducing agent, a complexing agent for the cupric ion, and a pH adjuster. The plating baths also preferably include a cyanide ion source and a surface active agent.

The cupric ion source generally used is a cupric sulfate or a cupric salt of the complexing agent to be employed. When employing cupric sulfate, it is typical to use amounts from about 3 to about 15 grams/liter and most typically from about 8 to about 12 grams/liter. The most common reducing agent employed is formaldehyde which is generally used in amounts from about 0.7 to about 7 grams per liter and most preferably from about 0.7 to about 2.2 grams per liter. Examples of some other reducing agents include formaldehyde precursors or derivatives such as paraformaldehyde, trioxane, dimethyl hydantoin, glyoxal; borohydrides such as alkali metal borohydrides (sodium and potassium borohydride) and substituted borohydrides such as sodium trimethoxyborohydride; boranes such as amineborane (isopropyl amine borane and morpholine borane). Hypophosphite reducing agents can also be used for electroless Ni and Cu plating.

Examples of some suitable complexing agents include Rochelle salts, ethylene diamine tetraacetic acid, the sodium (mono-, di-, tri-, and tetra-sodium) salts of ethylene diamine tetraacetic acid, nitrilotetraacetic acid and its alkali salts, gluconic acid, gluconates, triethanol amine, glucono-(gamma)-lactone, modified ethylene diamine acetates such as N-hydroxyethyl ethylene diamine triacetate. In addition, a number of other suitable cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 grams/liter, or in a 3-4 fold molar excess.

The plating bath can also contain a surfactant that assists in wetting the surface to be coated. A satisfactory surfactant is, for instance, an organic phosphate ester available under the trade designation Gafac RE-610. Generally, the surfactant is present in amounts from about 0.02 to about 0.3 grams/liter. In addition, the pH of the bath is also generally controlled, for instance, by the addition of a basic compound such as sodium hydroxide or potassium hydroxide in the desired amount to achieve the desired pH. The preferred pH of the electroless plating bath is between 11.6 and 11.8.

Also the plating bath can contain a cyanide ion, about 10 to about 25 milligrams per liter to provide a cyanide ion concentration in the bath within the range of 0.0002 to 0.0004 molar. Examples of some cyanides which can be employed according to the present invention are the alkali metal, alkaline earth metal, and ammonium cyanides. In addition, the plating baths can include other minor additives as is well known in the prior art.

The plating baths generally employed have a specific gravity within the range of 1.060 to 1.080. In addition, the temperature of the bath is usually maintained between 70° and 80° C. and most usually between 70° and 75° C.

In addition, if desired, the plating with the copper can be carried out employing dual plating bath techniques such as those along the lines suggested in U.S. Pat. Nos. 4,448,804 and 4,525,390, disclosures of which are incorporated herein by reference.

The following nonlimiting examples are presented to further illustrate the present invention.

EXAMPLE 1

An epoxy-glass fiber prepreg is placed in a reaction chamber of a plasma generating apparatus available under the trade designation Phoenix Material Company (PMC) model 711 unit. Ammonia is conveyed at a rate of about 1000 standard cubic centimeters per minute to the top circular metallic electrode of the apparatus. The pressure employed is about 450 millitorr, the power about 380 watts, and the power density is about 0.5 watts per centimeter square of the area of the lower electrode. The treatment is carried out for about 30 minutes.

The substrate is then immersed in a bath of about 1.5 grams per liter of $PdCl_2$, about 100 grams per liter of $SnCl_2$, and about 280 milliliters per liter of 37% HCl at about 65° F for about three minutes. The substrate is then accelerated with an 8% hydrochloric acid solution.

The substrates are then analyzed for seeder retention by the direct current plasma procedure. In particular, a known surface area of the seeded substrate is digested in aqua regia to remove the tin and palladium compounds. The sample is diluted to a known volume and aspirated into an argon plasma at about 3,000° K.—5,000° K. between tungsten electrodes. The hot plasma causes the elements to emit at characteristic wavelengths. The emission is compared to standard samples from which the concentration in the solution and thus the amount on a given volume of substrate can be calculated. The reported values are micrograms (ug)/cm². The procedure is run twice. The average palladium found is 2.61 ppm and the average tin found is 2.27 ppm. A photoresist is applied to the seeded substrate and the photoresist is imaged and developed. The substrate containing the developed photoresist is then immersed in a copper electroless additive plating bath and plated to a thickness of about 2 mils. The electroless plating bath contains about 10 grams per liter of $CuSO_4 \cdot 5H_2O$, 35 grams per liter of ethylene diamine tetraacetic acid dihydrate, 0.25 grams per liter of Gafac RE-610, about 14 milligrams per liter of sodium cyanide and about two milliliters per gram of 37% aqueous formaldehyde. The specific gravity of the plating bath is about 1.07, the pH is 11.7 by the addition of NaOH and the temperature of the bath is about 73° C. ±5° C. The oxygen content of the bath is maintained at about 2.5 to about 3.5 ppm. The gas flow rate is about 12 SCFM.

The substrates are then tested for peel strength by the procedure discussed by Lee, et al., Micromechanics of Multilayer Printed Circuit Boards, IBM, Journal of Research and Development, Vol. 28, No. 6, November 1984, Paper 715, under the heading "PTH peel test", disclosure of which is incorporated herein by reference. The peel strength is about 8.15 pounds per inch.

COMPARISON EXAMPLE 2

The above procedure is repeated, except that the epoxy prepreg is not pretreated in accordance with the plasma treatment of the present invention. The results obtained are about 0.84μg/cm² of palladium and about 0.74μg/cm² of tin. In addition, the peel strength is only about 5.36 pounds per inch.

EXAMPLES 3-10

Example 1 is repeated, except that the plasma treatment employs the parameters recited in the table below. Also included in table 1 below are the results from Example 1 and comparison Examples 2 and 3 to facilitate comparing the effect of the present invention with the prior art.

A comparison of the treatment of the present invention with no treatment clearly illustrates the improved results obtained by the present invention.

TABLE

| Example No. | Power (Watts) | % Amine | Pressure (mT) | Sn (μg/cm²) | Pd (μg/cm²) | Peeling Strength (lbs/in) |
|---|---|---|---|---|---|---|
| No. Treatment | 2 | | | | 0.74 | 0.84 | 5.36 |
| $NH_3$ Plasma | 1 | 380 | 0 | 450 | 2.64 | 3.03 | 8.15 |
| $NH_3$ Plasma | 3 | 350 | 0 | 500 | 2.33 | 2.68 | 7.32 |
| $NH_3$ Plasma | 4 | 380 | 0 | 500 | 2.43 | 2.82 | 6.89 |
| $NH_3$ Plasma | 5 | 410 | 0 | 450 | 2.06 | 2.33 | 7.24 |
| $NH_3$ + Ethylene diamine | 6 | 380 | 0 | 550 | 2.53 | 2.82 | 7.91 |
| | 7 | 410 | 0 | 550 | 2.47 | 2.77 | 7.12 |
| $NH_3$ + Ethylene dia- | 8 | 380 | 15 | 500 | 3.11 | 3.60 | 6.62 |
| | 9 | 380 | 30 | 500 | 2.51 | 3.03 | 7.47 |
| | 10 | 380 | 60 | 500 | 2.75 | 3.32 | 6.73 |

TABLE-continued

| Example No. | Power (Watts) | % Amine | Pressure (mT) | Sn (µg/cm²) | Pd (µg/cm²) | Peeling Strength (lbs/in) |
| --- | --- | --- | --- | --- | --- | --- | mine

Having thus described our invention, what we claim as new and desire to secure by Letters Patent is:

1. A method for improving the retention of colloidal catalyst on at least one preconditioned surface having active sites of a dielectric substrate material for the electrodes plating of a conductive metal thereon wherein said dielectric substrate includes an epoxy having polar groups that are reactive with ammonia or amines which comprises exposing said preconditioned substrate to a gaseous plasma from a gas selected from the group of ammonia, organic amines, or mixtures thereof; and then activating the substrate by contacting it with a composition containing a colloidal catalyst to provide directly, or as a precursor leading to catalytic sites capable of electroless plating, initiation of a conductive metal thereon whereby said exposing increases the retention of said colloidal catalytic sites on said at least one preconditioned surface.

2. The method of claim 1 wherein said gaseous plasma is from ammonia.

3. The method of claim 1 wherein said gaseous plasma is from the mixture of ammonia and an organic amine.

4. The method of claim 1 wherein said plasma is from a mixture of ammonia and ethylene diamine.

5. The method of claim 1 wherein the pressure of the plasma treatment is about 0.1 torr to about 4 torr.

6. The method of claim 1 wherein the pressure of the plasma treatment is about 0.2 torr to about 0.8 torr.

7. The method of claim 1 wherein the surface is activated with a composition containing a palladium compound.

8. The method of claim 1 wherein said surface is activated with a composition containing palladium chloride.

9. The method of claim 8 wherein said palladium chloride composition contains about 1.2 to about 2.5 grams per liter of palladium chloride, about 80 to about 150 grams of stannous chloride, and about 100 to about 150 milliliters per liter of 7% HCl.

10. The method of claim 1 wherein the activating is with a composition containing about 1.5 grams per liter of $PdCl_2$, about 100 grams per liter of $SnCl_2$, and about 280 milliliters per liter of 37% aqueous HCl.

11. The method of claim 1 which additionally includes contacting the activated surface with an electroless plating bath containing conductive metallic ions therein.

12. The method of claim 11 wherein said conductive ions include nickel or copper.

13. The method of claim 11 wherein said conductive ions include copper.

14. The method of claim 1 wherein said at least one surface includes through-holes in a substrate.

15. The method of claim 1 wherein said at least one surface includes a major surface on a substrate.

* * * * *